United States Patent [19]
Kaiser

[11] 3,943,546
[45] Mar. 9, 1976

[54] TRANSISTOR
[75] Inventor: Reinhold Kaiser, Heilbron, Germany
[73] Assignee: Telefunken Patentverwertungsgesellschaft m.b.H., Ulm, Germany
[22] Filed: Dec. 21, 1971
[21] Appl. No.: 210,458

Related U.S. Application Data
[62] Division of Ser. No. 845,773, July 29, 1969, Pat. No. 3,673,012.

[30] Foreign Application Priority Data
Aug. 1, 1968  Germany.......................... 1764766

[52] U.S. Cl. ..................... 357/36; 357/20; 357/34; 357/68
[51] Int. Cl.² ......................................... H01L 29/72
[58] Field of Search............. 317/235 Z; 357/20, 34, 357/36

[56] References Cited
UNITED STATES PATENTS
3,191,070   6/1965   Jones et al. ..................... 317/235 Z

*Primary Examiner*—William D. Larkins
*Attorney, Agent, or Firm*—Spencer & Kaye

[57] ABSTRACT

An improved transistor, such as a control transistor, of the type having a plurality of strip-like emitter regions formed in a single base region in a semiconductor body. The strip-like emitter regions are of different widths and preferably are positioned in spaced side by side relationship and decrease in width in the direction of succession of the strips.

7 Claims, 4 Drawing Figures

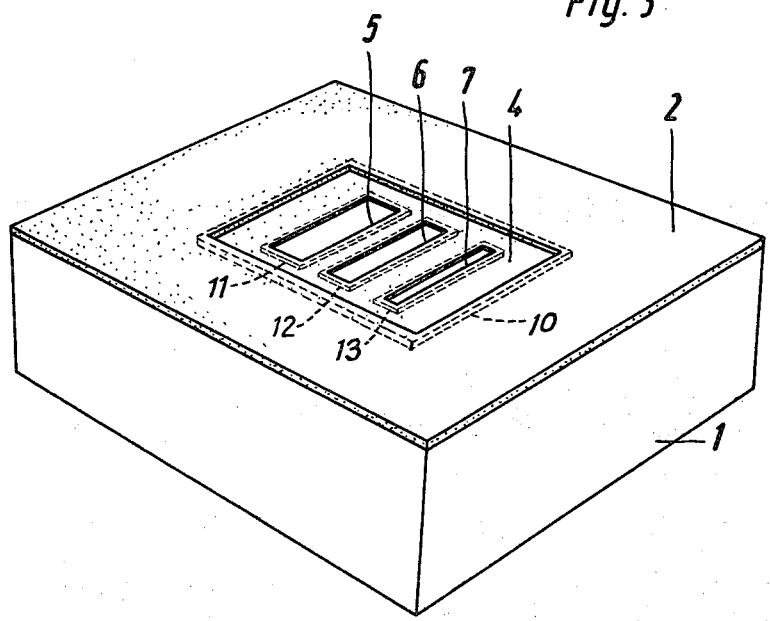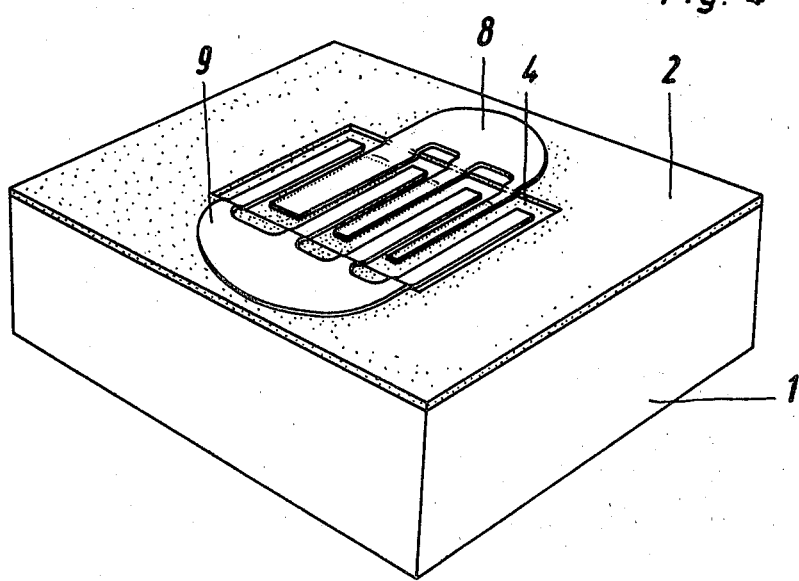

3,943,546

TRANSISTOR

CROSS-REFERENCE TO RELATED PATENT APPLICATION

This application is a division of applicant's copending U.S. Pat. application, Ser. No. 845,773, filed July 29th, 1969, now U.S. Pat. No. 3,673,012 issued June 27th, 1972.

BACKGROUND OF THE INVENTION

The present invention relates to an improved transistor, and in particular a control transistor. More particularly, the present invention relates to an improved transistor having a plurality of strip-like emitter zones formed in a single base zone adjacent a single major surface of a semiconductor body.

SUMMARY OF THE INVENTION

According to the invention, in a transistor having a plurality of strip-like emitter regions or zones formed in the single base zone and extending to a single major surface of the transistor semiconductor body, the plurality of emitter zones are of different widths. As a result of forming the emitter zones in this manner, the control characteristics of the transistor are improved. This is particularly the case if the strip-like emitter zones are disposed in the base zone in side by side parallel relationship, like the rungs of a ladder, with the width of the strip-like emitter zones decreasing in the direction of succession of the emitter zones.

Such a transistor can easily be produced by forming the plurality of strip-like emitter zones by diffusion through a corresponding plurality of strip-like apertures of different widths in an insulating or diffusion masking layer overlying the surface of the semiconductor body.

BRIEF DESCRIPTION OF THE DRAWINGS

FIG. 3 is a perspective view showing the formation of strip-like apertures in the insulating layer for diffusion of the emitter impurity material in still a further step in forming the transistor according to the invention.

FIG. 4 is a perspective view showing the finished transistor according to the invention.

DESCRIPTION OF THE PREFERRED EMBODIMENT

Figure 1:
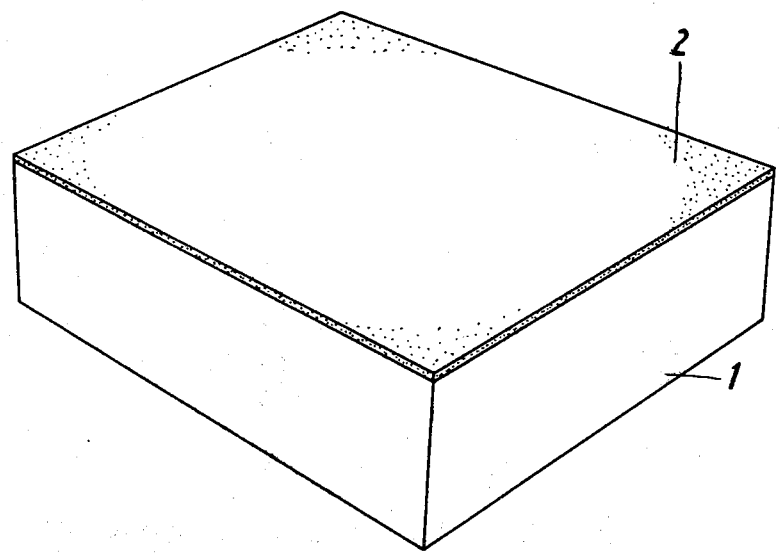
FIG. 1 is a perspective view of a semiconductor body with an insulating layer on a major surface thereof during the initial step of forming a transistor according to the invention.

Referring now to the figures, the transistor according to the invention will be described by means of the method in which it is produced. In order to produce a transistor according to the invention, as shown in FIG. 1, the starting point is a semiconductor body 1, for example, of silicon. The semiconductor body 1 is of $n$-type conductivity, for example, and has a specific resistance of about 10 Ohmcm. An insulating layer 2, which may, for example, consist of silicon dioxide or of silicon nitride, is applied to at least a major surface of the semiconductor body 1. The thickness of the insulating layer 2 may amount to $1\mu$, for example.

Figure 2:
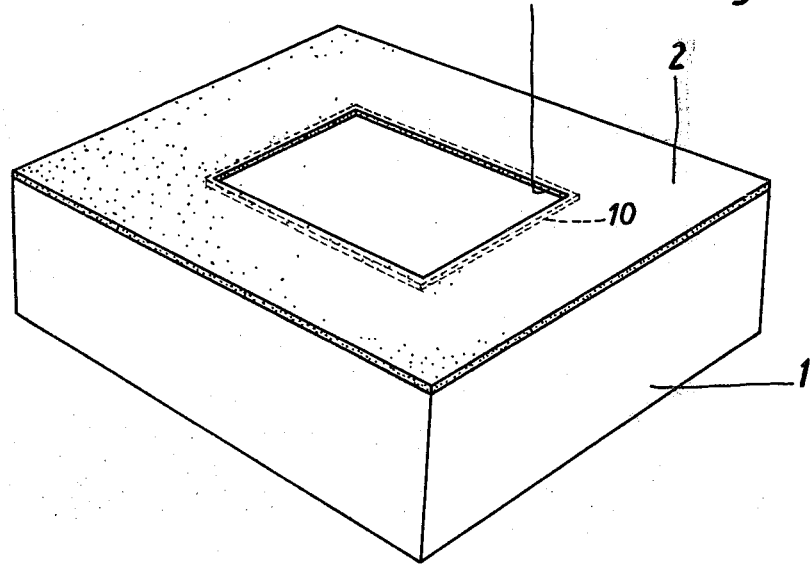
FIG. 2 is a view similar to FIG. 1 showing the aperture for the diffusion of the base impurity material in the insulating layer during a further step in forming the transistor according to the invention.

A base diffusion window 3, the size of which may be $40\mu$ by $60\mu$ for example, is formed in the insulating layer 2 as shown in FIG. 2. In a known manner the base region or zone 10 is then formed in the semiconductor body 1 through this base window 3, for example by the diffusion of boron into the surface of the semiconductor body at a temperature of 1100°C. The thickness of the base region 10 may amount to $6\mu$ for example.

After or during the base diffusion, oxidation of the semiconductor surface is again effected so that the portion of the semiconductor surface within the base window 3 is again covered with an oxide layer 4. Emitter diffusion windows or apertures 5, 6 and 7 are then formed in this oxide layer 4. As shown in FIG. 3, the emitter diffusion windows 5, 6 and 7 have different widths, and consequently, the emitter regions of the transistor according to the invention will also have correspondingly different widths.

As shown in FIG. 3, the emitter diffusion windows 5–7 are preferably disposed in a side by side relationship parallel to one another with their respective widths decreasing in the direction of succession of the windows 5–7, i.e. in the illustrated example the widths of the windows 5–7 decrease from left to right. Consequently, the diffusion window 5 has the greatest width, the middle diffusion window 6 has the second greatest width, while the right-hand diffusion window 7 has the narrowest width. For example, the width of the left-hand emitter diffusion window 5 may be $6\mu$, the width of the middle emitter diffusion window 6 be $4\mu$ and the width of the right-hand emitter diffusion window 7 be $2\mu$. A greater or smaller number of emitter diffusion windows may, of course, be disposed side by side. The length of the strip-like emitter diffusion windows 5, 6 and 7 illustrated in FIG. 3 may be $30\mu$ for example.

The production of the emitter regions or zones 11–13 in the semiconductor body 1 is effected by means of a common diffusion process through the individual emitter diffusion windows 5–7. That is to say, impurities are diffused into the semiconductor body 1 or into the base region 10 already present in the semiconductor body 1, through all the emitter diffusion windows 5–7 in a common diffusion process. A suitable doping material for producing the emitter regions 11–13 is, for example, phosphorus which is diffused into the semiconductor body 1 at a temperature of, for example, 1100°C. As a result of the different width emitter diffusion windows 5–7, the respective strip-like emitter regions 11–13 produced by the diffusion process will have correspondingly different widths. Consequently with the emitter diffusion windows dimensioned as shown in FIG. 3, the strip-like emitter regions 11–13 will also be in parallel side by side relationship and have widths which decrease in the direction of succession of the emitter regions, i.e. from left to right, with the emitter region 11 being the widest and the emitter region 13 being the narrowest.

It has been found that a planar transistor, or indeed any transistor, wherein the emitter diffusion is effected through emitter diffusion windows of different widths in an insulating layer present on the semiconductor body and serving as a diffusion mask, surprisingly has particularly satisfactory control characteristics.

Making of contact to the emitter regions 11–13 diffused into the semiconductor body 1 is effected by vapour deposition of contact-making material on the regions of the semiconductor surface exposed through the emitter diffusion windows 5, 6 and 7. In order to make contact to the base region 10, additional windows or apertures (not illustrated in FIG. 3) must be formed in the oxide layer 4.

FIG. 4 shows the control transistor according to the invention with the emitter and base contacts fully provided. As this Figure shows, contact is made both to the emitter regions 11–13 and to the base region 10 by means of a comb-like structure in a well known manner. The common emitter electrode is designated by the reference numeral 8 in FIG. 4, while the base electrode has the reference numeral 9. As can be easily seen the common emitter electrode 8 contacts each of the emitter regions while the common base electrode 9 contacts the underlying single base region adjacent each of the emitter regions and intermediate same.

It will be understood that the above description of the present invention is susceptible to various modifications, changes and adaptations, and the same are intended to be comprehended within the meaning and range of equivalents of the appended claims.

I claim:

1. In a transistor formed in a semiconductor body, said transistor having at least three individual strip-like emitter zones formed in a single base zone and extending to a single major surface of said semiconductor body, the improvement wherein each of said strip-like emitter zones has a width different from the widths of the other emitter zones.

2. A transistor as defined in claim 1 wherein said strip-like emitter zones are arranged in a spaced side by side relationship.

3. A transistor as defined in claim 2 wherein said strip-like emitter zones are parallel to one another.

4. A transistor as defined in claim 2 wherein said strip-like emitter zones have decreasing widths in the direction of the succession of said strip-like emitter zones.

5. A transistor as defined in claim 4 wherein said strip-like emitter zones are diffused zones.

6. A transistor as defined in claim 4 wherein each of said emitter zones is approximately $2\mu$ wider than the adjacent emitter zone.

7. A transistor as defined in claim 4 wherein the width of said strip-like emitter zones are approximately $6\mu$, $4\mu$ and $2\mu$, respectively.

* * * * *